United States Patent [19]
Jun

[11] Patent Number: 5,936,564
[45] Date of Patent: Aug. 10, 1999

[54] DIGITAL TO ANALOG CONVERTER USING PULSE WIDTH MODULATION AND THE CONTROLLING METHOD THEREOF

[75] Inventor: Sung-Gon Jun, Suwon, Rep. of Korea

[73] Assignee: SamSung Electronics Co., Ltd., Kyungki-do, Rep. of Korea

[21] Appl. No.: 08/890,481

[22] Filed: Jul. 9, 1997

[30] Foreign Application Priority Data

Jul. 9, 1996 [KR] Rep. of Korea ...................... 96-27679

[51] Int. Cl.$^6$ ..................................... H03M 1/66
[52] U.S. Cl. ............................................. 341/144
[58] Field of Search .................................. 341/144, 120, 341/53, 147, 152

[56] References Cited

U.S. PATENT DOCUMENTS 4,532,496  7/1985  Ichinose .
4,891,828  1/1990  Kawazoe .................................. 377/114

*Primary Examiner*—Brian Young
*Attorney, Agent, or Firm*—Robert E. Bushnell, Esq.

[57] ABSTRACT

A digital to analog converter using pulse width modulation is disclosed. The digital to analog converter according to the invention comprises a PWM pulse generator and an integrator. First, the PWM pulse generator includes a first data buffer 100 and a second data buffer 200. First data buffer 100 is provided with an input terminal for receiving digital signals having control value $D_{in}$ produced by the system controller, for example, in response to a key input. Second data buffer 200 is provided for storing the previous control value $D_{in-1}$. The new input data stored in first data buffer 100 and second data buffer 200 are compared one another in a controller 600. The controller 600 is provided for receiving the output signal of comparator 500 and for supplying control signals with a pulse generator 300 and a time constant selector 400 based on the comparator output signal. The time constant selector 400 may include a number of resistors which can be selected through an electronic switch in response to the control signal fed from the controller 600. The pulse generator produces a pulse signal in which duty ratio of the pulse signal can be varied by the control signal; also the time constant selector selects a resistance value of the time constant of the integrator which converges the input pulse signal from the pulse generator on a DC voltage value proportional to the duty ratio of the pulse signal. According to this invention, the speeding up of the response time of the analog output signal can be possible by reducing the transient period and also the magnitude of ripple can be reduced which result in enhancing the quality of the output signal.

11 Claims, 8 Drawing Sheets

DIGITAL TO ANALOG CONVERTER USING PULSE WIDTH MODULATION AND THE CONTROLLING METHOD THEREOF

CLAIM OF PRIORITY

This application makes reference to, incorporates the same herein, and claims all benefits accruing under 35 U.S.C §119 from an application entitled *Digital To Analog Converter Using Pulse width Modulation And The Controlling Method Thereof* earlier filed in the Korean Industrial Property Office on Jul. 9, 1996, and there duly assigned Ser. No. 96-27679 by that Office.

BACKGROUND OF THE INVENTION

1. Field of the Invention

The present invention relates to digital to analog converters, and more particularly to a digital to analog converter using pulse width modulation and adopted for use with computer monitors, and to the method for controlling the same.

2. Background Art

Generally, a data input device and a data processing unit of a computer peripheral are provided to deal with digital data. Once the user of a device operates a key or button, digital data is generated in the input device and the data is supplied to the data processing unit or microcontroller to produce output digital data for driving actuators or for controlling operation of the device. The output digital data often requires controlling analog circuits and other system elements with an analog voltage or current. To satisfy this requirement, digital to analog converters (DACs) have been used. U.S. Pat. No. 4,532,496 to Kazuaki Ichinose entitled *Pulse Width Modulation Type Digital To Analog Converter* describes one example of a known type of DAC.

Another example of a DAC is typically implemented by a number of binary weighted resistors supplied with a reference voltage through digitally controlled electronic switches, in which an analog voltage is produced proportional to the digital input. The DAC can be made up of a pulse generator and an integrator where the pulse generator produces a pulse signal corresponding to the digital input and through the integrator the pulse signal is converted into an analog voltage signal. Such a DAC is exemplified by FIG. 1, for use in a computer monitor. The monitor has a control panel which has a plurality of keys, or buttons, 10 for controlling horizontal size, horizontal position, vertical size, vertical position of an image by pressing the corresponding buttons. A key signal of a key 10 is supplied to a microcontroller 20 which produces a digital signal having a control value Din corresponding to a key input. Then a pulse generator 30 receives the digital signal Din and generates a pulse signal having a pulse width Tw proportional to the digital input value. The output pulse signal of pulse generator 30 is supplied to an integrator 40 which converges the input pulse signal on a DC voltage value proportional to the duty ratio of the pulse signal.

In FIG. 2, there is shown one example of integrator 40 which has a resistor R1 and a capacitor C1. Also, an example of the output voltage signal Vout produced by integrator 40 is shown in FIG. 3. In FIG. 3, the output voltage Vout can be expressed by the following:

$$Vout \propto \frac{Tw}{T} \times Vcc$$

where Tw is a width of the input pulse signal and T is the pulse period, and Vcc represents the voltage level of the input pulse.

The output voltage signal Vout of integrator 40 is supplied to a horizontal/vertical output circuit 50 to control the horizontal/vertical size or position of the display image, which are controlled in proportion to the voltage level of the output signal Vout.

FIG. 4 illustrates the analog output signal of the integrator 40, occurring in the form of a ripple current at the steady operation period. The ripple of the analog output will function as a noise. Further, FIGS. 5 and 6 illustrate both the magnitude of the ripple and the converging speed of the analog output signal occurring during the transient period until it reached the steady state.

Referring to FIG. 5, if the time constant of the integrator is set to a relatively low value, the converging speed becomes fast, however it can be seen that the magnitude of the ripple becomes large accordingly. Conversely, at FIG. 6, if the time constant of the integrator is set to relatively high value, the magnitude of the ripple becomes small but the problem is that the converging speed becomes slow, which result in lowering of system response speed.

SUMMARY OF THE INVENTION

It is therefore an object of the invention to provide a digital to analog converter using pulse width modulation, capable of speeding up the converging speed as well as minimizing the ripple of the analog output signal.

It is another object of the invention to provide a method for controlling the digital to analog converter using pulse width modulation, such that the converging speed of the analog output signal to reach the desired set point is increased, and the ripple of the analog output signal is minimized.

According to one aspect of the present invention, there is provided a digital to analog converter using pulse width modulation, comprising: a first data buffer provided with an input terminal for receiving digital signals having control value produced by the system controller in response to a control key input; a second data buffer provided for storing a previous control value which was output from the first data buffer; a comparator for comparing the control value stored in the first data buffer with the previous control value stored in the second data buffer; a pulse generator for producing a pulse signal in which the duty ratio of the pulse signal can be varied by a control signal; an integrator for converging the input pulse signal from the pulse generator on a DC voltage value proportional to the duty ratio of the pulse signal; a controller for receiving the output signal of the comparator and for discriminating the output signal of the comparator to produce control signals supplied to the pulse generator and the integrator for controlling pulse width and the time constant, respectively.

Preferably, the control means transfers the input data value of the first buffer to the second data buffer after completion of the comparing the two data values.

According to another aspect of the present invention, there is provided a method for controlling the digital to analog converter using pulse width modulation, which method comprises the steps of: discriminating the input of a new control value of a digital input signal; controlling the pulse width of a pulse signal output by a pulse generator and/or the time constant of an integrator at a transient period based on a comparison output signal resulting from a comparison of a new control value with a previous control value; and maintaining the present voltage level of the analog output.

More specifically, a transient period control step comprises the steps of producing a control signal for controlling the pulse generator to produce a pulse signal with preset normal pulse width; comparing a digital input data having a control value stored at a first buffer with the previous control value of previous digital input data stored in a second buffer; decreasing the time constant of an integrator that outputs the analog signal if it is found that the difference between the two control values is higher than a preset value; and transferring the data stored in the first buffer to the second data buffer for replacing the previous data with the new input value.

In the digital to analog converter in accordance with the present invention, the speeding up of the response time of the analog output signal can be possible by reducing the transient period and also the magnitude of ripple can be reduced which result in enhancing the quality of the output signal.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION OF PREFERRED EMBODIMENTS

This invention will be described in detail with reference to the embodiment of the invention shown in FIGS. 7–13.

Figure 1:
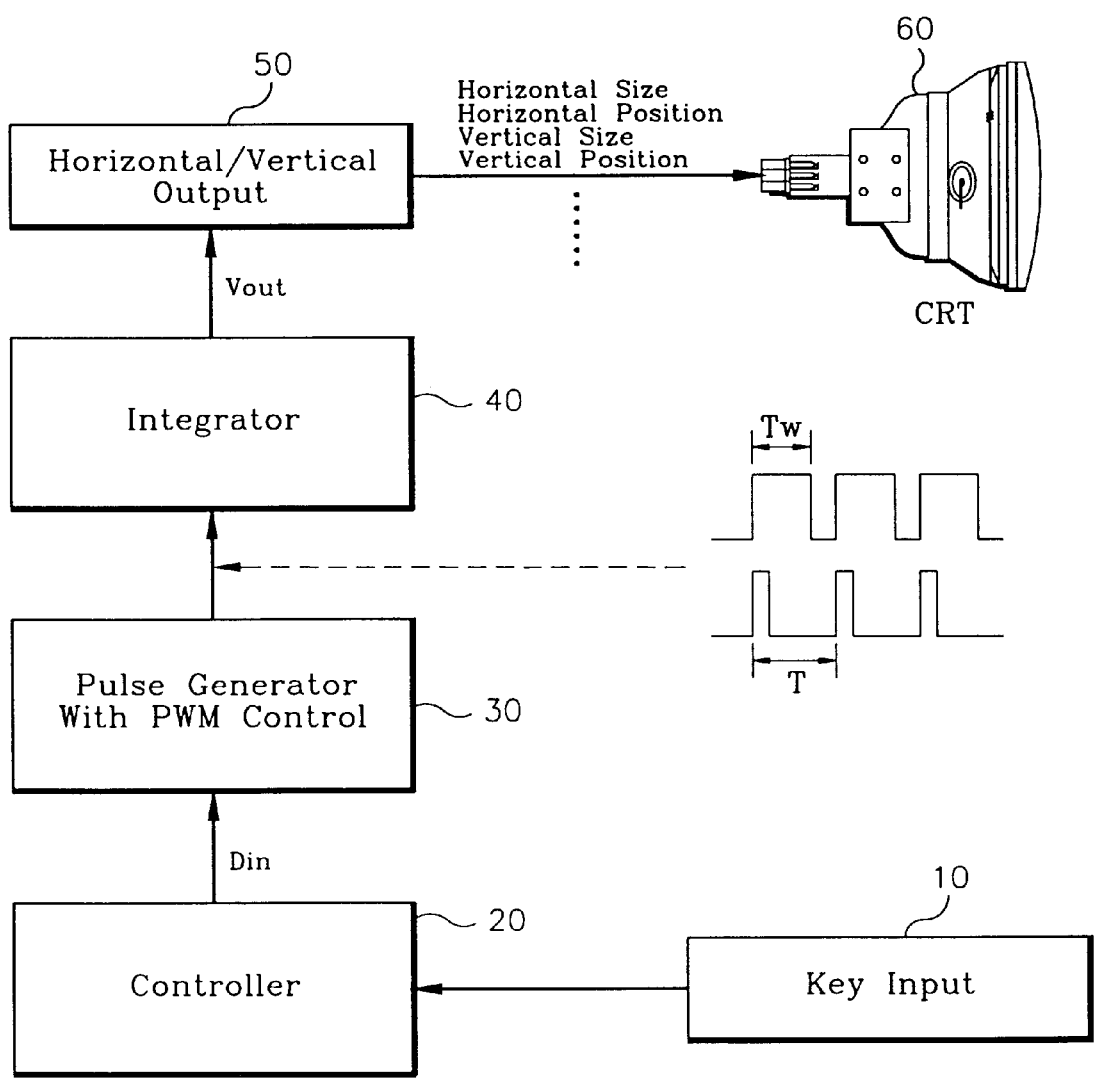
FIG. 1 is a diagram for explaining a prior art digital to analog converter for use in controlling a computer monitor screen.
Figure 2:
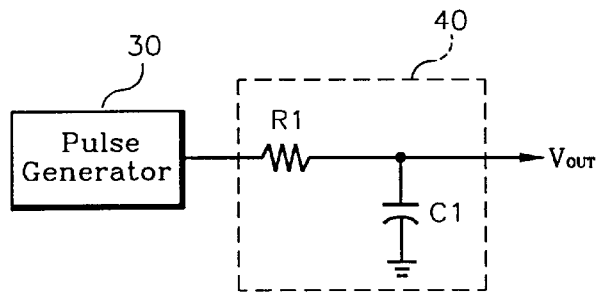
FIG. 2 is a circuit diagram of the integrator shown in FIG. 1.
Figure 3:
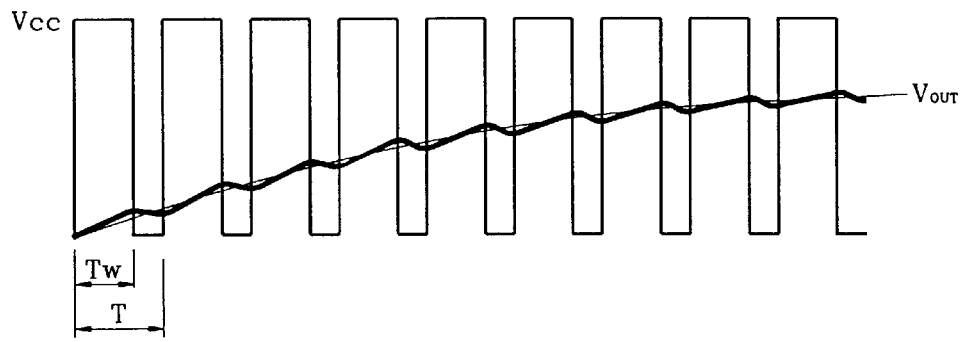
FIG. 3 is a waveform depiction of the analog output of the integrator relating to the input pulse generated by the PWM pulse generator of FIG. 2.
Figure 4:
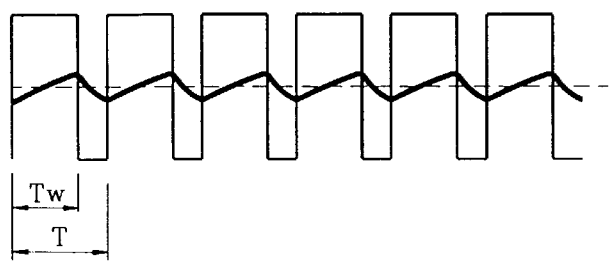
FIG. 4 is a view depicting the ripple of the analog output of the integrator of FIG. 3 at steady operation period.
Figure 5:
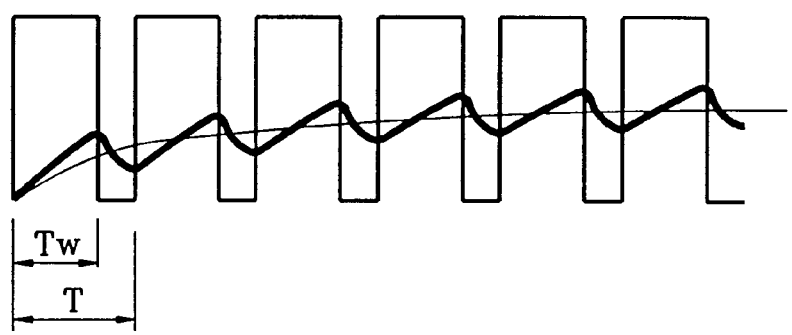
FIG. 5 is a similar view as FIG. 3, depicting both the magnitude of the ripple and the converging speed of the analog output, when the time constant of the integrator has low value.
Figure 6:
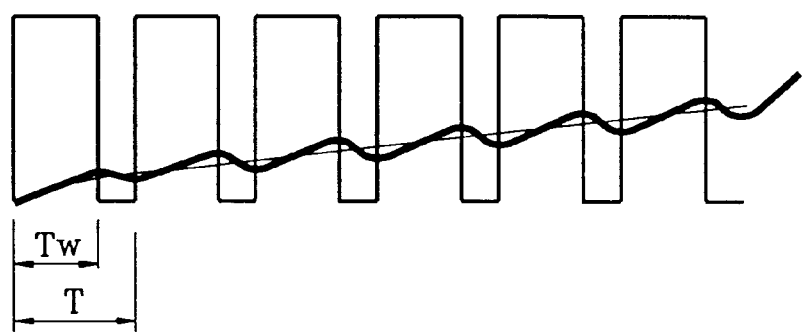
FIG. 6 is a similar view as FIG. 3, depicting both the magnitude of the ripple and the converging speed of the analog output, when the time constant of the integrator has high value.
Figure 7:
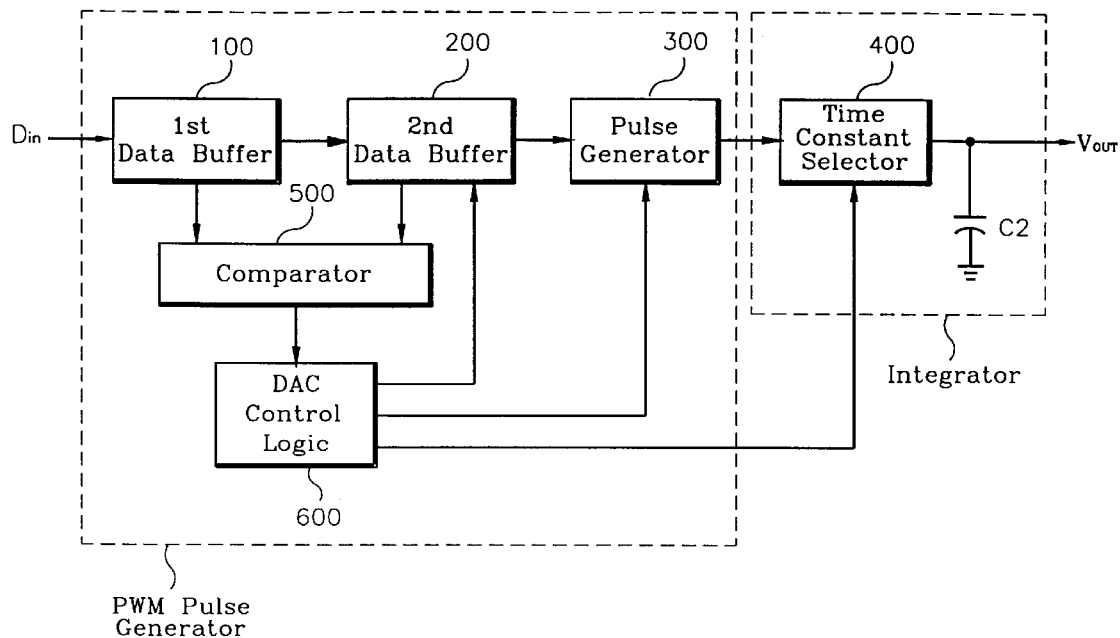
FIG. 7 is a block diagram showing a digital to analog converter in accordance with the principles of the present invention.

Referring to FIG. 7, there is shown a digital to analog converter using pulse width modulation adopted for use in a computer monitor in accordance with the present invention. The digital to analog converter comprises a PWM pulse generator and an integrator. First, the PWM pulse generator includes a first data buffer 100 and a second data buffer 200. First data buffer 100 is provided with an input terminal for receiving digital signals having a control value $D_{in}$ produced by a system controller (not shown), for example, in response to a key input. Second data buffer 200 is provided for storing previous control value $D_{in-1}$, wherein $D_{in-1}$ is $D_{in}$ delayed by first data buffer 100 for one period. The outputs of first data buffer 100 and second data buffer 200 are connected with two inputs of a comparator 500. A digital to analog converter (DAC) controller 600 is provided for receiving the output signal of comparator 500, resulting from comparing control value $D_{in}$ with previous control value $D_{in-1}$, and in response thereto, for supplying control signals to a pulse generator 300 and a time constant selector 400 of the integrator. DAC controller 600 supplies a control signal to second data buffer 200 for controlling the transfer of the control value $D_{in}$ from first data buffer 100 to second data buffer 200 as the previous control value $D_{in-1}$.

DAC controller 600 is made up of a microcomputer having control programs for pulse generator 300 and time constant selector 400. Preferably, DAC controller 600 can be formed such that comparator 500 and DAC controller 600 are an integral unit. In this case, DAC controller 600 supplies the control value $D_{in}$ to second data buffer 200 as the previous control value $D_{in-1}$.

Time constant selector 400 may include a number of resistors which can be selected through an electronic switch in response to the control signal fed from DAC controller 600.

The digital input signal having control value $D_{in}$ input to first data buffer 100 corresponds to a desired set point of the analog output signal. Comparator 500 compares control value $D_{in}$ with previous control value $D_{in-1}$. The comparator output signal is supplied to DAC controller 600 to generate control signals based on the result of the comparison. The value of the comparator output is discriminated by the DAC controller 600 and classified into three states. First, a transition-up state is determined when the new control value is larger than the previous one. Secondly, a transition-down state is determined when the new control value is smaller than the previous one. Third, a steady state is determined when the transition period is terminated and the analog output voltage reaches the desired set point. Also, the transient period is determined by the difference value of the new set point and the present level of the analog output voltage.

Figure 8:
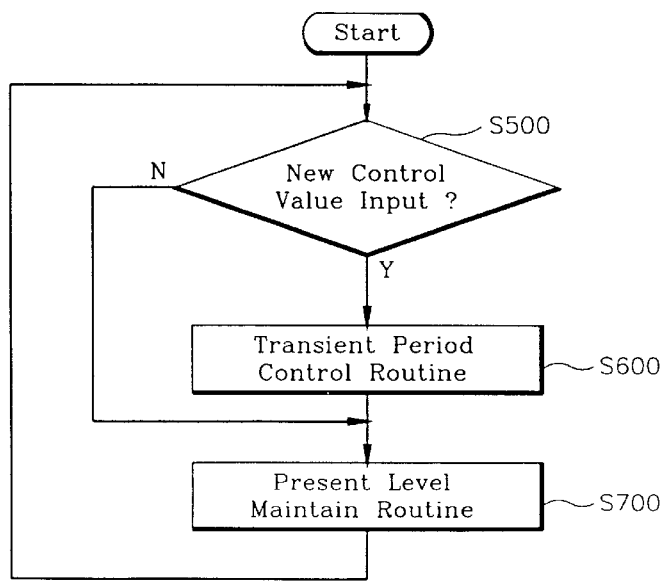
FIG. 8 is a flow diagram showing a method for controlling the digital to analog converter in accordance with the principles of the present invention.

Referring to FIG. 8, there is shown a controlling method of DAC controller 600 in accordance with the invention. Briefly, the controlling method comprises steps of discriminating the input of a new control value $D_{in}$ of the digital input signal (step 500), controlling the pulse width of pulse generator 300 and/or the time constant of time constant selector 400 of the integrator at the transient period of the analog output (step 600), and maintaining the present voltage level of the analog output (step 700).

At step 500, when a new control value $D_{in}$ is input to first data buffer 100, the process proceeds to transient period control step 600 in order to vary the response time for reaching the set point of the analog voltage level. When no new control value is input at step 500, or transient period control step 600 has finished, the process proceeds to present voltage level maintaining step 700 in order to maintain the voltage level of the analog output at the end of the transient period.

In step 600, the transient period control step 600 is classified into three cases; a time constant control, a pulse width control, and both the time constant control and the pulse width control, as explained below with regard to FIGS. 9–11, respectively.

Figure 9:
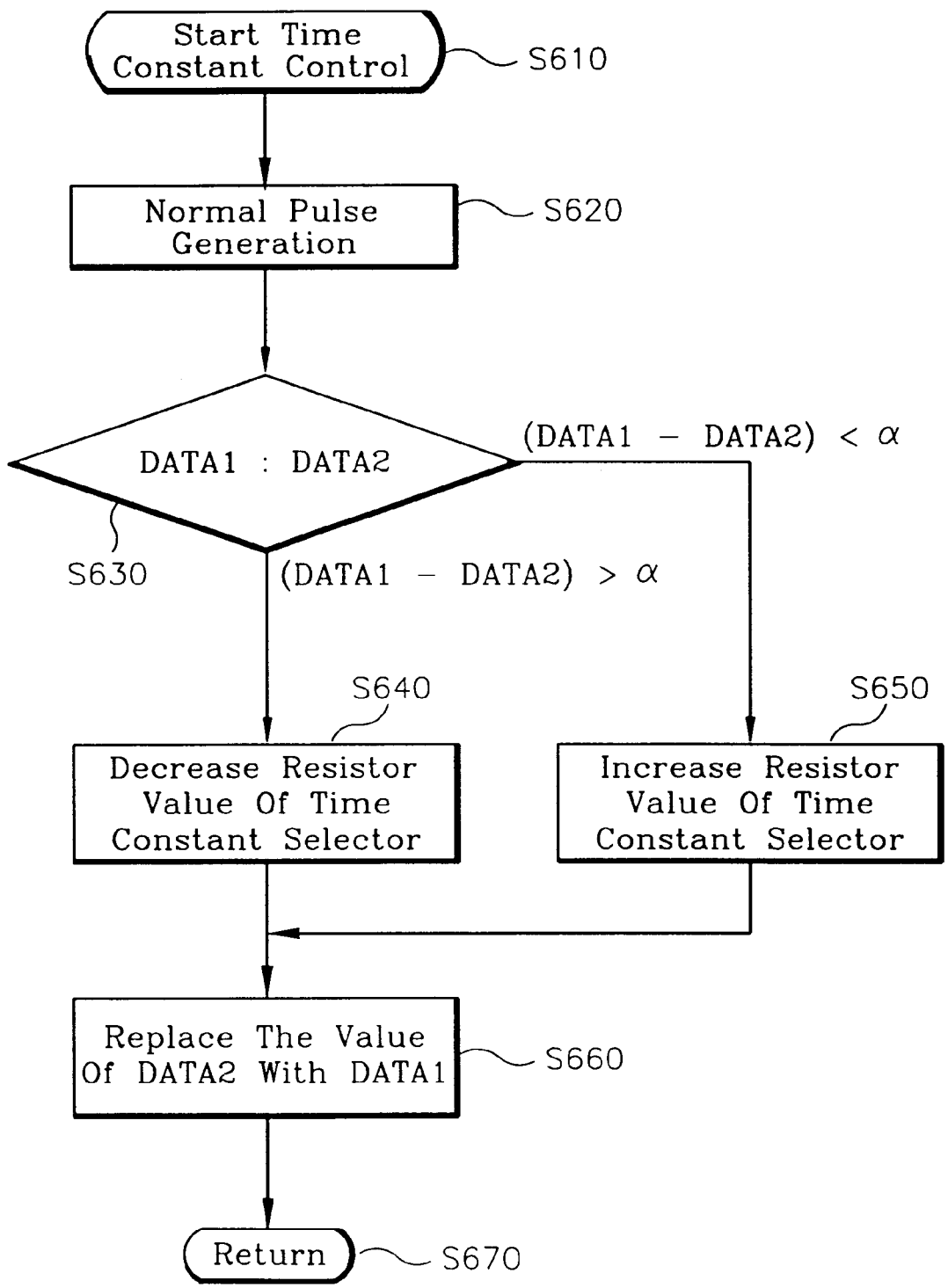
FIG. 9 is a flow diagram of the transient time control routine of FIG. 8, in which the time constant control is performed in accordance with the principles of the present invention.

The time constant controlling process performed during the transient period is shown in FIG. 9. When the time constant control routine is started at step 610, pulse generator 300 is controlled to produce a pulse signal with a preset normal pulse width at step 620. At step 630, the data $D_{in}$ (hereafter referred to as DATA1) stored at first buffer 100 and the data $D_{in-1}$ (hereafter referred to as DATA2) stored in second buffer 200 are compared to one another by comparator 500. When it is found that the difference between the two data values is higher than the preset value α, a control for decreasing the time constant of the integrator is performed at step 640 by supplying a switch control signal to time constant selector 400 so that it may decrease the resistance value of time constant selector 400.

Conversely, when it is found that the difference between the two data values is lower than preset value α, a control for increasing the time constant of the integrator is performed at step 650 by supplying a switch control signal to the time constant selector 400 so that it may increase the resistance value of time constant selector 400.

At the completion of the time constant control steps 640 or 650, input data transfer step 660 is performed. In step 660, the data DATA1 stored in the first buffer 100 is transferred to second data buffer 200, replacing the previous data DATA2. Then, the process returns to the main control routine of FIG. 8.

With this time constant controlling process, increasing the system response time is possible, since the time constant of the integrator is controlled during the transient period with locking the pulse width produced at pulse generator 300. Further, at the end of the transient period, in the steady state, the present voltage level maintaining step 700 is performed to maintain the voltage level of the analog output signal, which reduces the magnitude of the ripple thereof.

Figure 10:
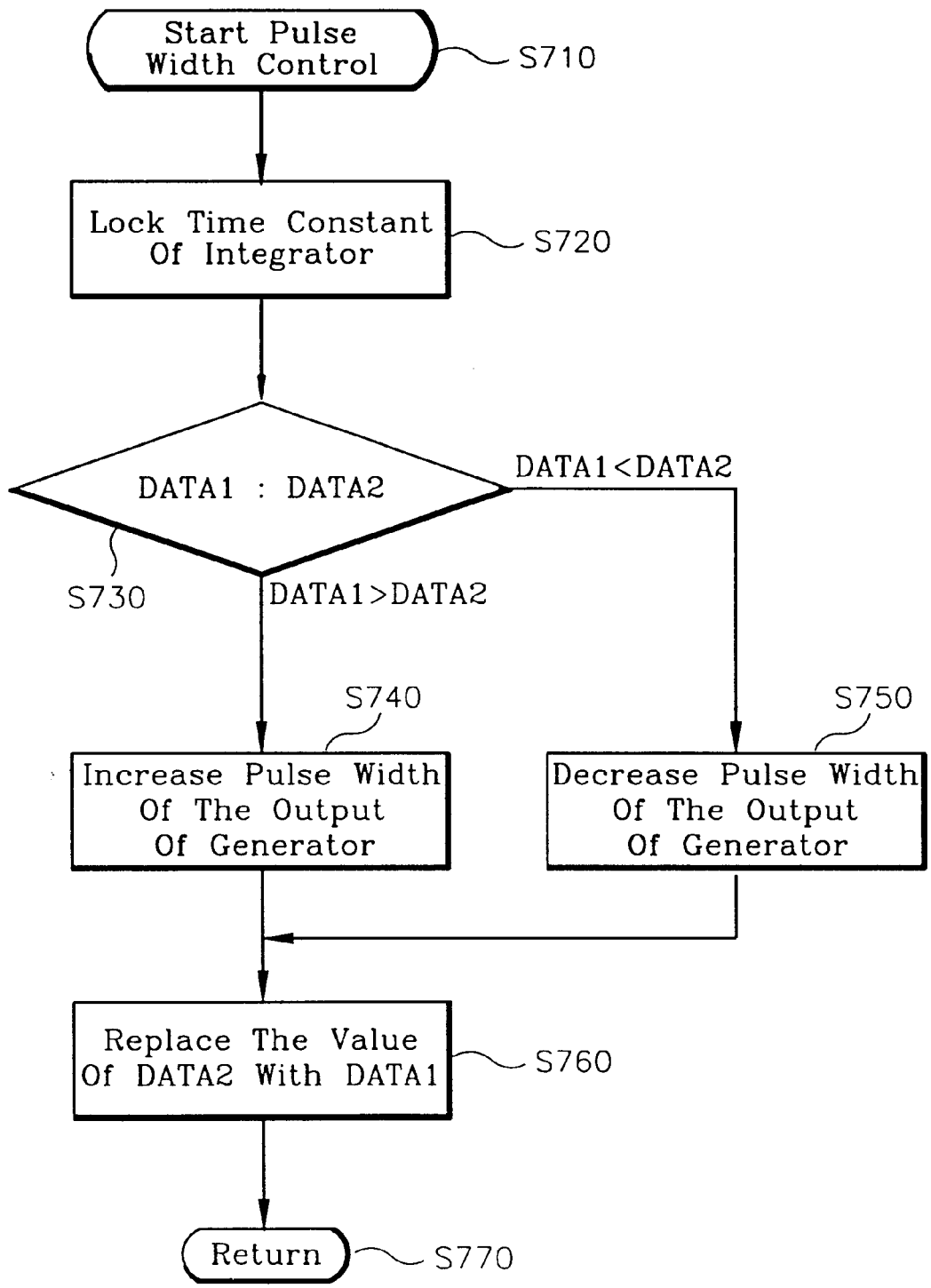
FIG. 10 is a flow diagram of the transient time control routine of FIG. 8, in which the pulse width control is performed in accordance with the principles of the present invention.

The process for controlling the pulse width of the output pulse signal generated at the pulse generator 300 during the transient period is shown in FIG. 10. When the pulse width control routine is initiated at step 710, time constant selector 400 is controlled to select a preset resistance that provides a normal time constant at step 720. At step 730, the data stored in first buffer 100 and second buffer 200 are compared to one another by comparator 500. When it is found that the value of the data DATA1 stored in first buffer 100 is higher than the data value DATA2 stored in second buffer 200, a control signal for increasing the pulse width of the output pulse generated at pulse generator 300 is supplied to pulse generator 300 from DAC controller 600 at step 740.

Conversely, when it is found that the value of the data DATA1 stored in first buffer 100 is lower than the data DATA2, a control signal for decreasing the pulse width of the output pulse generated at pulse generator 300 is supplied to pulse generator 300 from DAC controller 600 at step 750.

At the completion of the pulse width control steps 740 or 750, the input data transfer step 760 is performed. In step 760, the data DATA1 stored in first buffer 100 is transferred to second data buffer 200, replacing the previous data DATA2. Then, the process returns to the main control routine of FIG. 8 at step 770.

With this pulse width control process, increasing the system response time is possible, since the pulse width at the output of pulse generator 300 is controlled during the transient period with locking the time constant of the integrator. Further, at the end of the transient period, the present voltage level maintaining step 700 is performed to maintain the voltage level of the analog output signal.

Figure 11:
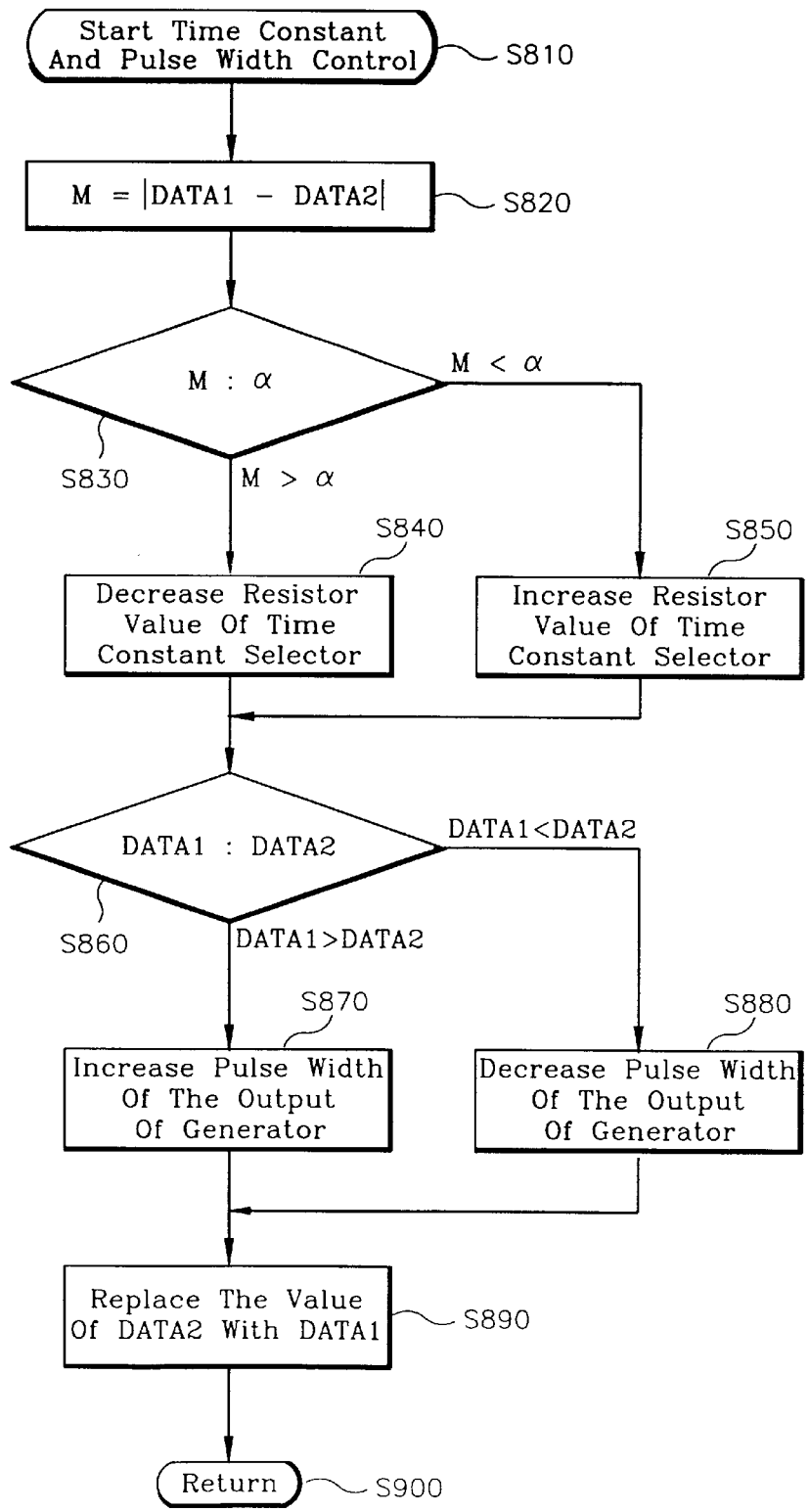
FIG. 11 is a flow diagram of the transient time control routine of FIG. 8, in which both the time constant control and the pulse width control are performed in accordance with the principles of the present invention.

The time constant and the pulse width control process during the transient period is shown in FIG. 11. When the control routine is started at step 810, at step 820 comparator 500 obtains an absolute value of the difference M between the data DATA1 stored in first buffer 100 and the data DATA2 stored in second buffer 200. This absolute difference value M is stored in DAC controller 600. At step 830, the absolute difference value M is compared with the preset value α. When it is found that the value M is higher than the value α, a switch control signal for decreasing the time constant of the integrator is supplied to time constant selector 400 in step 840 so that time constant selector 400 may select a lower resistance value.

Conversely, when it is found that the value M is lower than the value α, a switch control signal for increasing the time constant of the integrator is supplied to time constant selector 400 so that time constant selector 400 may select a higher resistance value.

At the next step 860, another comparing step is performed by comparator 500 by comparing the data stored at first buffer 100 and the data stored at second buffer 200. When it is found that the value of the data DATA1 stored in first buffer 100 is higher than the value of data DATA2 stored in second buffer 200, a control signal for increasing the pulse width of the output pulse generated by pulse generator 300 is supplied to pulse generator 300 from DAC controller 600 in step 870. When it is found at step 860 that the value of the data DATA1 is lower than the value of data DATA2, a control signal for decreasing the pulse width of the output pulse generated by pulse generator 300 is supplied to pulse generator 300 from DAC controller 600 in step 880.

After completion of pulse width control steps 870 or 880, the input data transfer step 890 is performed. In step 890, the data DATA1 stored in first buffer 100 is transferred to second data buffer 200, replacing the previous data DATA2. Then, the process returns to the main control routine of FIG. 8.

With this control method, increasing the system response time is possible, since both the time constant and the pulse width is controlled during the transient period of the analog output signal. Also, at the end of the transient period, the present voltage level maintaining step 700 of FIG. 8 is performed to maintain the desired voltage level of the analog output signal, which reduces the magnitude of the ripple thereof.

Figure 12:
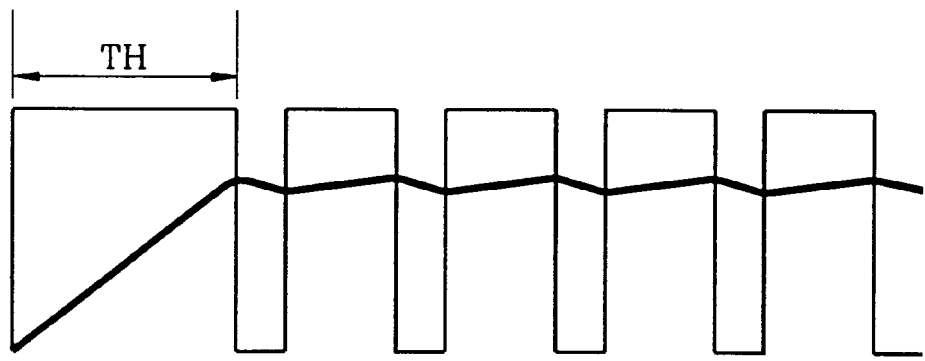
FIG. 12 is a waveform depiction of the analog output signal produced in accordance with the principles of the present invention at the transition up state and the steady state.
Figure 13:
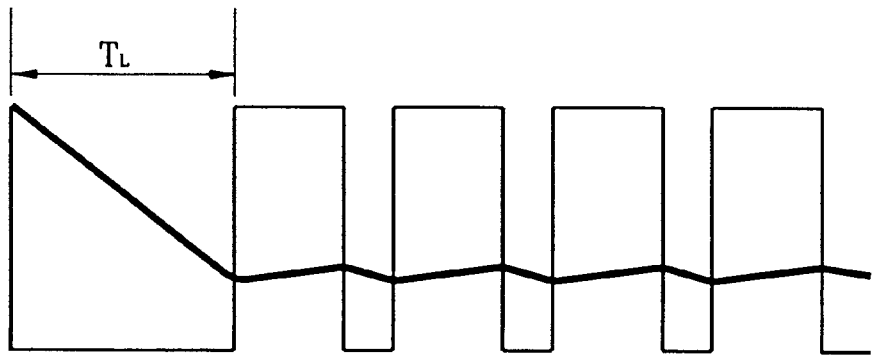
FIG. 13 is a similar view as FIG. 12, showing waveform of the analog output signal at the transition down state and the steady state.

FIG. 12 and FIG. 13 schematically show an analog output signal of the D/A converter controlled through the method of this invention. FIG. 12 shows the analog output signal at the transition up state, and FIG. 13 shows the analog output signal at the transition down state. During the transition up period TH, the output pulse supplied from pulse generator 300 maintains a high voltage level (Vcc), and during the transition down period $T_L$, the output pulse is maintained at ground level. During the transition up/down period, the time constant is selected to have small value. In the steady state where the analog signal has reached the set point, the pulse generator produces a pulse signal having the same duty ratio as the voltage level of the analog output signal. During the steady state, the time constant is selected to have large value.

As apparent from foregoing, the digital to analog converter of this invention provides for an increase of the system response time by reducing the transient time for reaching the set point and minimizing of the ripple of the analog output signal at the steady state.

While the invention has been described in terms of an exemplary embodiment, it is contemplated that it may be practiced as outlined above with modifications within the spirit and scope of the appended claims.

What is claimed is:

1. A digital to analog converter using pulse width modulation, comprising:
   a first data buffer provided with an input terminal for receiving digital signals having a control value produced by a system controller in response to a control key input;
   a second data buffer provided for storing a previous control value;
   a comparator for comparing said control value stored in said first data buffer with said previous control value stored in said second data buffer;
   a pulse generator for generating a pulse signal having a duty ratio which can be varied in response to a first control signal;
   an integrator for receiving said pulse signal generated by said pulse generator, said integrator having a time constant value for converging said pulse signal on a DC voltage value proportional to said duty ratio of said pulse signal, wherein said time constant value can be varied in response to a second control signal; and
   control means for generating said first and second control signals in response to an output signal of said comparator.

2. The digital to analog converter as set forth in claim 1, wherein said control means controls transfer of said control value stored in said first data buffer to said second data buffer as said previous control value stored in response to said output signal of said comparator.

3. The digital to analog converter as set forth in claim 1, wherein said integrator comprises a time constant selector for varying said time constant value by varying a resistance value of said time constant selector in response to said second control signal.

4. The digital to analog converter as set forth in claim 1, wherein said control means operates in one of three modes, a time constant control mode, a pulse width control mode, and a time constant and pulse width control mode, said first control signal controlling said pulse generator to generate pulses having a constant duty ratio and said second control signal controlling said integrator for varying said time constant value when said control means is in said time constant control mode, said first control signal controlling said pulse generator for varying said duty ratio of said pulse signal and said second control signal controlling said integrator for maintaining a preset time constant value when said control means is in said pulse width control mode, and said first control signal controlling said pulse generator for varying said duty ratio of said pulse signal and said second control signal controlling said integrator for varying said time constant value when said control means is in said time constant and pulse width control mode.

5. A digital to analog converter using pulse width modulation, comprising:
   a first data buffer for storing a present control value produced by a system controller in response to a control key input;
   a second data buffer for storing a previous control value;
   a pulse generator for producing a pulse signal;
   an integrator comprising:
      a time constant selector having a selectable resistance value for varying a time constant of said integrator; and
      a capacitor; and
   means for producing first and second control signals based upon a result obtained by comparing said present control value to said previous control value, said first and second control signals being supplied to said pulse generator and said time constant selector for controlling a pulse width of said pulse signal and the time constant of said integrator, respectively.

6. The digital to analog converter as set forth in claim 5, wherein said first and second control signal producing means transfers the present control value to said second data buffer as said previous control value upon completion of the comparing of the present control value to the previous control value.

7. The digital to analog converter as set forth in claim 5, wherein said first and second control signal producing means operates in one of three modes, a time constant control mode, a pulse width control mode, and a time constant and pulse width control mode, said first control signal controlling said pulse generator to generate pulses having a constant pulse width and said second control signal controlling said time constant selector for selecting one of said resistance values to vary said time constant value when said control means is in said time constant control mode, said first control signal controlling said pulse generator for varying said pulse width of said pulse signal and said second control signal controlling said time constant selector for maintaining said resistance value as a selected one of said resistance values when said control means is in said pulse width control mode, and said first control signal controlling said pulse generator for varying said pulse width of said pulse signal and said second control signal controlling said time constant selector for selecting one of said resistance values to vary said time constant value when said control means is in said time constant and pulse width control mode.

8. A method for controlling the digital to analog converter using pulse width modulation, said method comprising the steps of:
   detecting an input of a new control value of a digital input signal produced by a system controller in response to a control key input and storing the new control value in a first data buffer via an input terminal;
   storing a previous control value in a second data buffer;
   comparing said new control value stored in said first data buffer with said previous control value stored in said second data buffer;

generating said first and second control signals in response to a result of said comparing step;

generating a pulse signal having a duty ratio which is variable in response to said first control signal;

converging, in response to a time constant value, said pulse signal on a DC voltage value proportional to said duty ratio of said pulse signal, wherein said time constant value is variable in response to said second control signal; and maintaining a present voltage level of said DC voltage value, when no new control value is detected or when said controlling step is ended.

9. A method for controlling the digital to analog converter as set forth in claim 8, further comprising steps of:

generating said pulse signal without varying said duty ratio;

determining whether a difference between said new control value and said previous control value is less than or greater than a preset value $\alpha$;

decreasing said time constant when it is determined that the difference between said new control value and said previous control value is greater than said preset value$\alpha$;

increasing said time constant when it is determined that the difference between said new control value and said previous control value is less than said preset value$\alpha$; and replacing said previous control value with said new control value and returning to said maintaining step.

10. A method for controlling the digital to analog converter as set forth in claim 8, further comprising steps of:

controlling a time constant selector of an integrator to select a preset resistance value that provides a predetermined time constant value of said integrator, wherein said integrator performs said converging step;

determining whether said new control value is less than or greater than said previous control value;

increasing the pulse width of said pulse signal when it is determined that said new control value is greater than said previous control value;

decreasing the pulse width of said pulse signal when it is determined that said new control value is less than said previous control value; and replacing said previous control value with said new control value and returning to said maintaining step.

11. A method for controlling the digital to analog converter as set forth in claim 8, further comprising steps of:

determining a difference between said new control value and said previous control value and calculating an absolute value of said difference;

comparing said absolute value to a preset value $\alpha$;

decreasing said time constant when it is determined that said absolute value is greater than said preset value $\alpha$;

increasing said time constant when it is determined that said absolute value is less than said preset value $\alpha$;

determining whether said new control value is less than or greater than said previous control value;

increasing the duty ratio of said pulse signal when it is determined that said new control value is greater than said previous control value;

decreasing the duty ratio of said pulse signal when it is determined that said new control value is less than said previous control value; and replacing said previous control value with said new control value and returning to said maintaining step.

* * * * *